Sept. 22, 1964 M. E. STANTON 3,150,013

MEANS AND METHOD FOR FABRICATING SEMICONDUCTOR DEVICES

Filed Feb. 17, 1960

INVENTOR.
Max E. Stanton
BY
Robert E. Fowler
ATTORNEY 3,150,013

MEANS AND METHOD FOR FABRICATING SEMICONDUCTOR DEVICES

Max E. Stanton, Kokomo, Ind., assignor to General Motors Corporation, Detroit, Mich., a corporation of Delaware Filed Feb. 17, 1960, Ser. No. 9,249
3 Claims. (Cl. 148—1.5)

The present invention relates to improvements in obtaining satisfactory rectifying contact areas in the fabricating of semiconductor devices. Since semiconductor devices are physically small it is of utmost importance that there be maximum contact area between the elements forming the same, for example, the indium disc and the germanium wafer in P–N junction. Since the contact area of the indium disc on the germanium wafer is small at best any reduction of this mutual contact area by poor contact attachment or wetting during alloying may reduce the current carrying capacity of the resultant device so that when completed the device may have to be rejected. It is, therefore, extremely important to take all precautions possible to obtain a maximum wetting of the surface of the germanium by the indium during alloying to result in maximum rectifying junction area.

It is, therefore, the object in making this invention to provide a method and means for obtaining a maximum area rectifying junction in the fabrication of semiconductor devices.

With these and other objects in view which will become apparent as the specification proceeds, my invention will be best understood by reference to the following specification and claims and the illustrations in the accompanying drawing, in which:

One of the problems involved in securing a good alloyed junction contact is to be sure that the oxide is completely removed from the adjacent surfaces prior to alloying. In order to do so both heat and hydrogen are introduced to the alloying area during the process. While I have shown in the accompanying drawings the illustration of alloying an indium disc to one side of a germanium wafer the means and method described can be used for alloying different configurations or different materials together. The particular example discloses a germanium wafer 2 to one side of which it is desired to alloy a mass of indium 4 to form a P–N rectifying junction.

Figure 1:
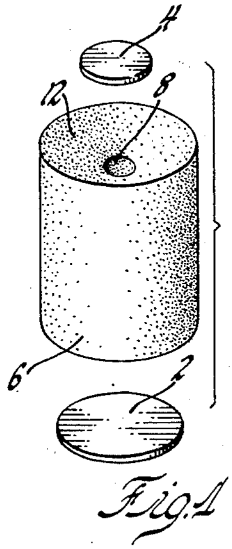
FIGURE 1 is an exploded perspective view showing the supporting means used in practicing my invention to maintain the two elements in spaced relation until the temperature can be sufficiently raised to the alloying point as will be explained.

FIGURE 1 discloses the two parts as separated by the graphite sleeve 6 which has a bore 8 therethrough having a diameter the size of the desired alloyed junction.

Figure 2:
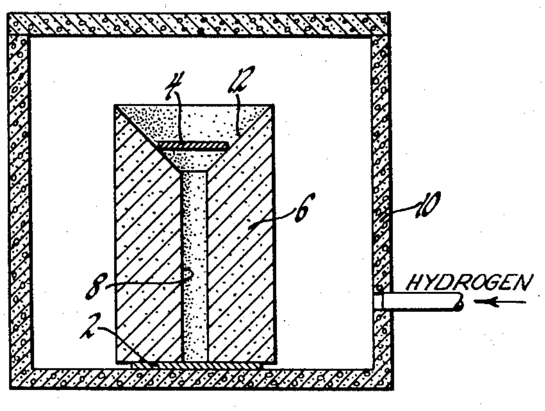
FIG. 2 is a sectional view through a furnace showing the parts in their initial position.
Figure 3:
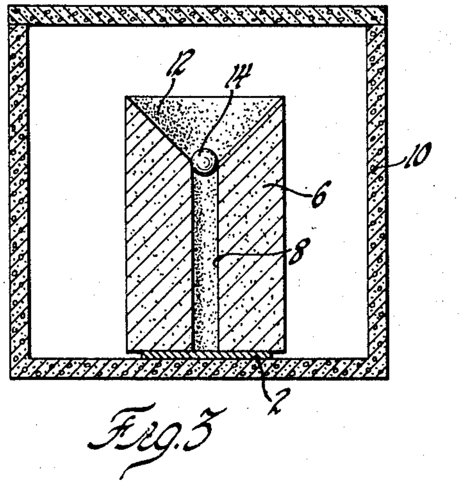
FIG. 3 is a view similar to FIG. 2 at the instant when the temperature reaches the point at which the indium disc assumes a spherical shape and starts its descent through the sleeve.
Figure 4:
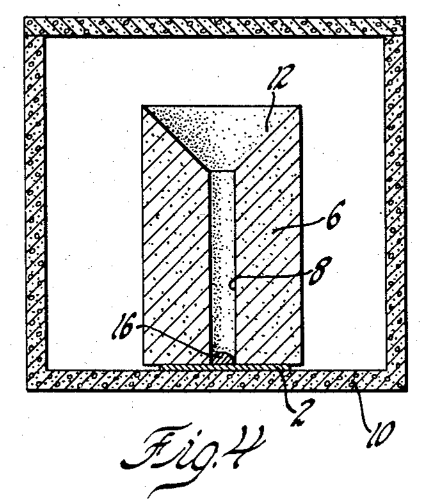
FIG. 4 is a view similar to FIGS. 2 and 3 showing the liquid indium mass in contact with the upper surface of the germanium disc and alloyed thereto as the temperature begins to fall; and, FIG. 5 is a perspective view of the resultant P–N junction.
Figure 5:
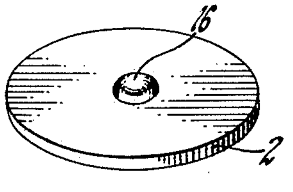

Referring now to FIG. 2 there is shown therein diagrammatically a furnace 10 and the germanium wafer 2 placed on the bottom thereof with the graphite sleeve 6 resting upon it with the bore 8 located at the point where it is desired the indium mass be alloyed. It is noted that the upper end of the central bore 8 terminates in a funnel-shaped section 12 in the upper end of the graphite sleeve. The indium disc 4 is placed in the funnel-shaped section 12 parallel to the germanium wafer 2 and it is desired to have just the correct amount of mass so that when the indium becomes molten and assumes a spherical shape, as shown in FIG. 3 at 14, its outer diameter will be substantially the same as the diameter of the bore 8 and the mass 14 will drop through the bore 8 to the upper surface of the germanium wafer 2. However, during the raising of the temperature to the required point it is desired to keep the two parts in spaced relation and this is accomplished by the graphite sleeve 6. As the heat is applied the melting point of indium, which is approximately 156° C., is first reached as the disc 4 begins to sag and tend to ball up but in the intermediate range from 156° C. to 500° C. while there is some change in the shape of the indium pellet, the full transformation to the spherical shape does not occur until all the oxides are removed and surface tension reaches its maximum value. The removal of the oxides does not appear to be effective by the hydrogen atmosphere until a temperature of 500° C. is reached. Above 500° C. the hydrogen atmosphere in the chamber removes the oxides from the indium causing it to assume its full spherical shape as shown at 14. This allows it to fall quickly through the bore 8 against the upper surface of the germanium wafer 2 where it is held against lateral movement by the lower end of the bore 8 as shown at position 16 and it alloys against the surface of the germanium. After a required time the temperature is reduced and the resultant P–N junction as shown in FIG. 5 is taken from the furnace as a finished unit.

In forming transistors the unit could then be inverted and by the use of the same process a similar disc be applied to the opposite side to form a P–N–P transistor.

This method and means may, of course, be used to form alloyed junctions with other metal to different semiconductor materials and in some instances it may not be necessary to introduce hydrogen to clean the oxides but they may be removed by other means.

What is claimed is:

1. In a method of alloying two metallic members together having different melting points, the steps of obtaining an elongated member having a central bore therethrough, placing the two members on opposite ends in vertical alignment so that one metallic member is in spaced relation above the other, both said metallic members being larger than said bore diameter, placing the grouping in an area to which heat can be applied, heating the grouping to the melting point of the uppermost one of the members having the lowest melting point to cause it to form into a pseudo spherical shape, introducing a deoxidizing gas into the area, increasing the temperature to a temperature at least three times that of the melting point of the uppermost member at which elevated temperature the oxides will be removed from the pseudo spherical molten body formed by the one of the members by the deoxidizing gas allowing the body to assume a full spherical shape due to applied heat which will pass through the bore of the elongated member causing it to fall through bringing it into contact with a defined area of the second metallic member to alloy thereto and lastly reducing the temperature to normal.

2. In a method of alloying two metallic parts together having different melting points, the steps of obtaining a spacing member having a central bore whose diameter is smaller than either part and whose area corresponds to the area on the face of one part that it is desired to alloy, placing said parts on opposite ends in vertical alignment with the part having the lower melting point at the upper end, placing the grouping in an area to which heat can be applied, said metallic parts being force biased toward one another by gravity but maintained spaced apart in their solid form by the spacing member, raising the temperature above the melting point of the metallic part at the upper end to cause it to become molten and assume a pseudo spherical shape, supplying deoxidizing gas to remove oxide film from the pseudo spherical molten part as the temperature rises and assumes a different geometrical configuration until it assumes a full spherical shape capable of passing through the central bore in the spacing member allowing it to drop through to bring it into contact with a face of the other member by passing through said bore due to gravity and alloy it to the face thereof.

3. In a method of alloying an indium member to a germanium wafer, the steps of obtaining a spacer of inert material having a central bore whose area is the size of the desired alloyed junction, placing it on the germanium wafer and the indium member in a cavity on the upper end of the spacer, placing the group in a furnace, raising the temperature of the furnace to the melting point of indium at which it assumes a pseudo spherical shape but will not be sufficiently small to pass through the central bore, continuing to raise the temperature in the furnace and introducing hydrogen into the same until the temperature has exceeded the melting point of indium by at least three times at which point the surface oxides will be removed from the indium by the hydrogen and the indium member will assume a full spherical shape and reach a diameter equal to the central bore permitting the indium sphere to pass therethrough bringing it into surface contact with a face of the germanium wafer at that temperature to alloy the two together over the area of contact defined by the end of the bore on the germanium wafer.

References Cited in the file of this patent

UNITED STATES PATENTS

| | | |
|---|---|---|
| 2,697,052 | Dacey | Dec. 14, 1954 |
| 2,743,693 | Schaper | May 1, 1956 |
| 2,781,481 | Armstrong | Feb. 12, 1957 |
| 2,888,782 | Epstein | June 2, 1959 |
| 2,939,205 | Sutherland et al. | June 7, 1960 |
| 2,943,005 | Rose | June 28, 1960 |

FOREIGN PATENTS

| | | |
|---|---|---|
| 794,128 | Great Britain | Apr. 30, 1958 |